United States Patent
Eom et al.

(10) Patent No.: US 10,804,459 B2
(45) Date of Patent: Oct. 13, 2020

(54) NON-COLLINEAR ANTIFERROMAGNETS FOR HIGH DENSITY AND LOW POWER SPINTRONICS DEVICES

(71) Applicant: Wisconsin Alumni Research Foundation, Madison, WI (US)

(72) Inventors: Chang-Beom Eom, Madison, WI (US); Tianxiang Nan, Madison, WI (US)

(73) Assignee: WISCONSIN ALUMNI RESEARCH FOUNDATION, Madison, WI (US)

(*) Notice: Subject to any disclaimer, the term of this patent is extended or adjusted under 35 U.S.C. 154(b) by 0 days.

(21) Appl. No.: 16/225,071

(22) Filed: Dec. 19, 2018

(65) Prior Publication Data
US 2020/0203601 A1 Jun. 25, 2020

(51) Int. Cl.
| | |
|---|---|
| H01L 43/10 | (2006.01) |
| H01L 43/04 | (2006.01) |
| H01F 10/12 | (2006.01) |
| H01F 10/00 | (2006.01) |
| H01L 43/06 | (2006.01) |

(52) U.S. Cl.
CPC ............ H01L 43/10 (2013.01); H01F 10/002 (2013.01); H01F 10/12 (2013.01); H01L 43/04 (2013.01); H01L 43/06 (2013.01)

(58) Field of Classification Search
CPC ....... H01L 43/10; H01F 10/002; H01F 10/012
USPC ........................................ 365/158, 171, 173
See application file for complete search history.

(56) References Cited

U.S. PATENT DOCUMENTS

| | | | |
|---|---|---|---|
| 9,502,087 B2 | 11/2016 | Buhrman et al. | |
| 2014/0142915 A1 | 5/2014 | Manipatruni et al. | |
| 2016/0173100 A1 | 6/2016 | Nikonov et al. | |
| 2017/0178705 A1 | 6/2017 | Buhrman et al. | |
| 2018/0166197 A1 | 6/2018 | Wang et al. | |
| 2019/0088300 A1* | 3/2019 | Yang | H01L 43/08 |
| 2019/0214548 A1* | 7/2019 | Schabes | H01L 27/222 |
| 2019/0304525 A1* | 10/2019 | Manipatruni | H01L 27/228 |

FOREIGN PATENT DOCUMENTS

KR 10-1386847 4/2014

OTHER PUBLICATIONS

Yu, Guoqiang, et al. "Switching of perpendicular magnetization by spin-orbit torques in the absence of external magnetic fields," Nature nanotechnology, vol. 9, Jul. 2014, pp. 548-554.
Fukami, Shunsuke, et al. "Magnetization switching by spin—orbit torque in an antiferromagnet—ferromagnet bilayer system." Nature Materials, vol. 15, May 2016, pp. 535-542.
Železný, Jakub, et al. "Spin-polarized current in noncollinear antiferromagnets," *Physical review letters* 119.18 (2017): 6 pages.

(Continued)

*Primary Examiner* — Han Yang
(74) *Attorney, Agent, or Firm* — Bell & Manning, LLC; Michelle Manning

(57) ABSTRACT

Spintronic devices based on metallic antiferromagnets having a non-collinear spin structure are provided. Also provided are methods for operating the devices. The spintronic devices are based on a bilayer structure that includes a spin torque layer of an antiferromagnetic material having a non-collinear triangular spin structure adjoining a layer of ferromagnetic material.

13 Claims, 11 Drawing Sheets

(56) References Cited

OTHER PUBLICATIONS

Matsunami, Daichi, et al. "Giant barocaloric effect enhanced by the frustration of the antiferromagnetic phase in Mn 3 GaN." *Nature materials* vol. 14. (2015), pp. 73-78.
Cubukcu et al., "Spin-orbit torque magnetization switching of a three-terminal perpendicular magnetic tunnel junction," Applied Physics Letters, vol. 104, 2014, pp. 042406-1 to 042406-5.
MacNeill et al., "Control of spin-orbit torques through crystal symmetry in $WTe_2$/ferromagnet bilayers" Nature Physics, 2016, pp. 1-7.
Zhang et al., "All-electrical manipulation of magnetization dynamics in a ferromagnet by antiferromagnets with anisotropic spin Hall effects," Physical Review B 92, pp. 144405-1 to 144405-7, 2015.
Zhang et al., "Giant facet-dependent spin-orbit torque and spin Hall conductivity in the triangular antiferromagnet $IrMn_3$," Sci. Adv. Sep. 30, 2016, pp. 1-8.
International Search Report and Written Opinion for PCT/US219/062178, dated Mar. 16, 2020.
Hwachol Lee et al., Ferromagnetic MnGaN thin films with perpendicular magnetic anisotropy for spintronics applications, Applied Physics Letters, pates 032403-1 too 032403-5, Jul. 31, 2015.

\* cited by examiner

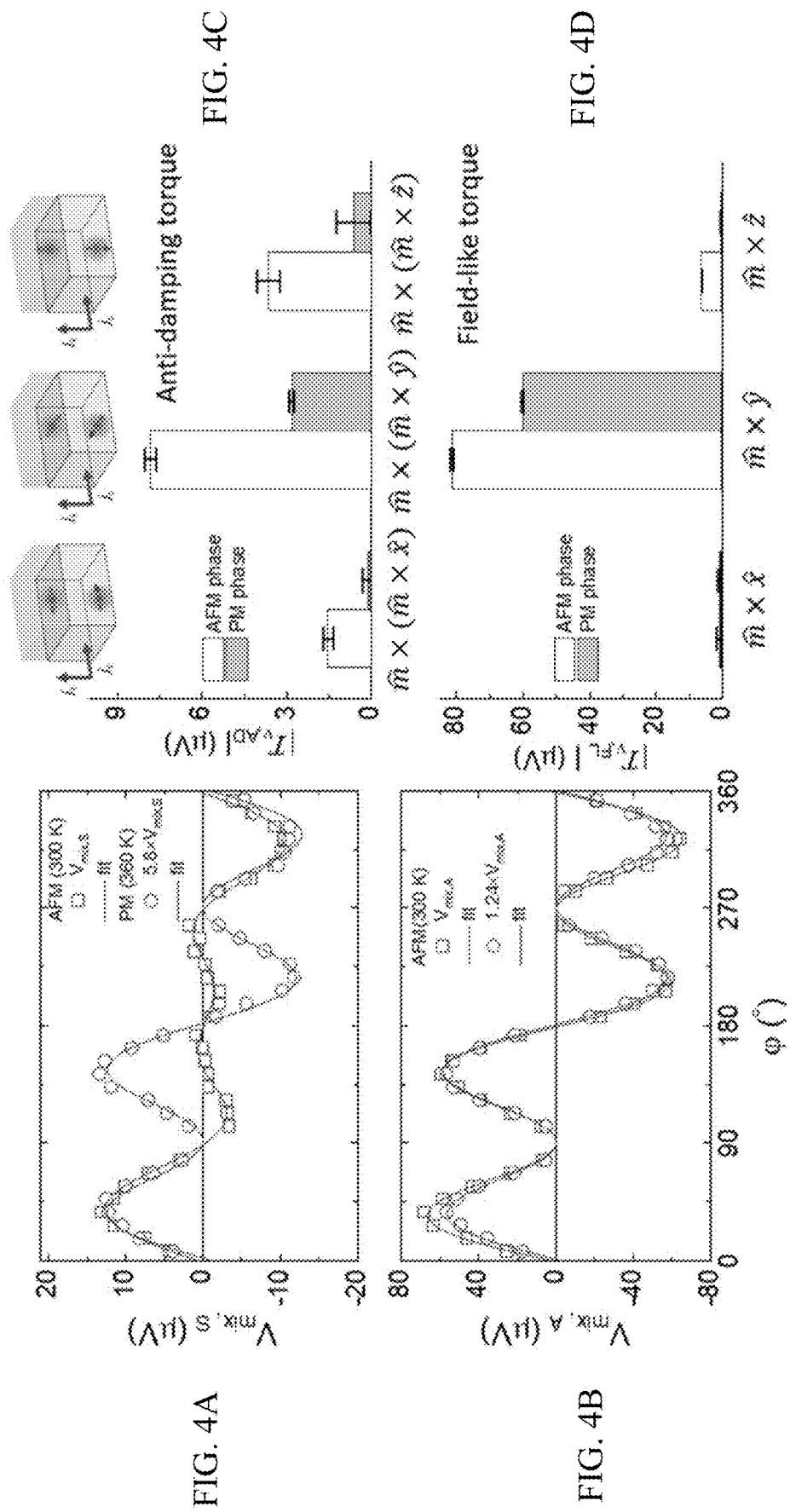

NON-COLLINEAR ANTIFERROMAGNETS FOR HIGH DENSITY AND LOW POWER SPINTRONICS DEVICES

REFERENCE TO GOVERNMENT RIGHTS

This invention was made with government support under 1629270 awarded by the National Science Foundation and W911-NF-17-1-0462 awarded by the ARMY/ARO. The government has certain rights in the invention.

BACKGROUND

In the classical picture of current-induced magnetization dynamics, charge currents flowing along the in-plane direction (x direction) generate out-of-plane spin currents (z direction) that have spin polarization σ, required by symmetry to be along the y direction. This particular spin current gives rise to an anti-damping spin torque in the adjacent ferromagnet, which has magnetization vector m, of the form of m×(m×y). This anti-damping torque is responsible for efficient magnetization manipulation, but as it is restricted to lie along an in-plane direction, it is efficient only for the in-plane magnetization manipulation. To efficiently and deterministically drive perpendicularly magnetized devices preferred for high-density memories, out-of-plane anti-damping torque is required.

SUMMARY

Spintronic devices based on metallic antiferromagnets having a non-collinear spin structure are provided. Also provided are methods for operating the devices.

One embodiment of a spintronic device includes: a ferromagnetic layer comprising a ferromagnetic material having perpendicular magnetization; a spin-torque layer comprising a metallic antiferromagnetic material having a non-collinear spin structure adjoining the ferromagnetic layer at an interface; and a current source configured to pass an in-plane charge current through the spin torque layer. In some embodiments of the devices, the metallic antiferromagnetic material having a having a non-collinear spin structure comprises a nitride having the formula $Mn_3AN$, where A is gallium, zinc, copper, or nickel.

One embodiment of a method of modulating the magnetization in a spintronic device of the type described herein includes passing an in-plane charge current through the spin-torque layer, whereby spin currents having out-of-plane spin polarizations are generated in the spin-torque layer giving rise to a spin torque in the ferromagnetic layer that modulates the magnetization of the ferromagnetic material.

The spintronic devices include three-terminal magnetic tunnel junction devices that include a magnetic tunnel junction comprising: a free magnetic layer comprising a ferromagnetic material; a pinned layer comprising a ferromagnetic material having a fixed direction of magnetization; and a barrier layer comprising an electrically insulating material separating the ferromagnetic layer from the pinned layer. The three-terminal devices further include: a spin torque layer comprising a metallic antiferromagnetic material having a having a non-collinear spin structure adjoining the free magnetic layer; a write current source configured to pass an in-plane charge current through the spin torque layer; a read current source configured to pass a charge current through the magnetic tunnel junction; and a voltage source configured to apply a bias voltage between the pinned layer and the spin-torque layer.

The three-terminal devices can be operated by passing an in-plane write current through the spin torque layer, whereby spin currents having out-of-plane spin polarizations are generated in the spin-torque layer, giving rise to a spin torque in the free magnetic layer that switches the magnetization of the free magnetic layer; and passing a read current through the magnetic tunnel junction and measuring the resistance of the magnetic tunnel junction.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1A depicts the crystallographic unit cell of antiperovskite $Mn_3GaN$ with the antiferromagnetic Γ5 g spin structure where Mn spins (arrows) formed a Kagome-type lattice in the (111) plane. The x, y, and z correspond to the cubic [100], [010], and [001] axis, respectively. FIG. 1B depicts the spin structure of $Mn_3GaN$ in the (001) plane. The dashed line corresponds to the (110) mirror plane. FIG. 1C depicts schematic illustrations of the Py/$Mn_3GaN$ bilayer and the allowed spin-Hall spin polarization in the low-symmetry state (a). This indicates non-zero spin-Hall conductivities $\sigma_{zx}^y$, $\sigma_{zx}^x$ and $\sigma_{zx}^z$, which correspond to spin polarizations along y, x and z direction, respectively (with the charge current along x and spin current along z). FIG. 1D depicts calculated spin-Hall conductivities $\sigma_{zx}^y$, $\sigma_{zx}^x$ and $\sigma_{zx}^z$ for $Mn_3GaN$ in the antiferromagnetic phase as a function of Fermi energy. FIG. 1E depicts the crystal structure of $Mn_3GaN$ without non-collinear spin structure (i.e. above the antiferromagnetic transition temperature TN) in the (001) plane, which gave rise to a high-symmetry state. FIG. 1F depicts the allowed spin polarization in the high-symmetry state, where only the conventional spin-Hall conductivity $\sigma_{zx}^y$ was non-zero.

FIG. 2A depicts a schematic of the MOKE experiments geometry, where the charge current was applied along x, and the magnetic moment of Py was parallel to the current direction. The laser was scanned perpendicular to the current flow direction across the device. FIG. 2B depicts a scanning transmission electron microscope image of Py/$Mn_3GaN$ heterostructure on (001) LSAT substrate with the top Py/$Mn_3GaN$ interface (left), and the bottom $Mn_3GaN$/LSAT interface (right). FIG. 2C and FIG. 2D depict the sum (FIG. 2C) and difference (FIG. 2D) of the MOKE signal across the device bar of 10 nm Py/20 nm $Mn_3GaN$. The solid horizontal line in FIG. 2C represents the offset of the sum trace. FIG. 2E depicts the spin-torque ratio with the spin polarization along y axis $\theta_y$ as a function of temperature. The dashed line denotes the Néel temperature $T_N$ of ~345 K determined from various measurements. FIG. 2F depicts the out-of-plane lattice parameter of a 30 nm $Mn_3GaN$/LSAT sample as a function of temperature.

FIG. 3A depicts a schematic of the ST-FMR geometry for the Py/$Mn_3GaN$. $\tau_\parallel$ and $\tau_\perp$ denotes the in-plane and out-of-plane torque components which consisted of different torque terms. FIG. 3B and FIG. 3C depict a ST-FMR spectral for the 10 nm Py/2 nm Cu/20 nm Mn$_3$GaN device bar (50 μm×100 μm) at 300 K (antiferromagnetic phase, FIG. 3B) and 360 K (paramagnetic phase, FIG. 3C) with the Py magnetization oriented at 40° and 220° relative to the current axis. The solid lines show the fit to a Lorentzian function. The microwave current was applied along x axis. The applied microwave frequency and power were 7 GHz and 12 dBm, respectively.

FIG. 4A-FIG. 4D depict angular dependence of ST-FMR. FIG. 4A depicts symmetric and FIG. 4B depicts antisymmetric ST-FMR components for the 10 nm Py/2 nm Cu/20 nm Mn$_3$GaN device as a function of the in-plane magnetic field angle at 300 K (antiferromagnetic phase, AFM) and 360 K (paramagnetic phase, PM). The charge current direction is fixed at the x axis. The applied microwave frequency and power are 7 GHz and 12 dBm, respectively. FIG. 4C depicts a summary of $T_{v,AD}$ values extracted from FIG. 4A that are proportional to the amplitude of anti-damping torque terms in AFM and PM phases. The insert schematic on the top panel shows the geometry of the spin-Hall effect with different spin polarizations. FIG. 4D depicts a summary of $T_{v,FL}$ values extracted from FIG. 4B that are proportional to the amplitude of field-like torque terms in AFM and PM phases.

Figure 5B:
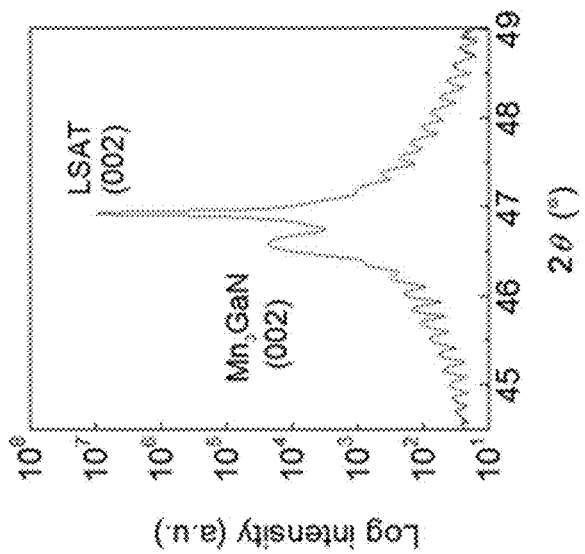
Figure 5A:
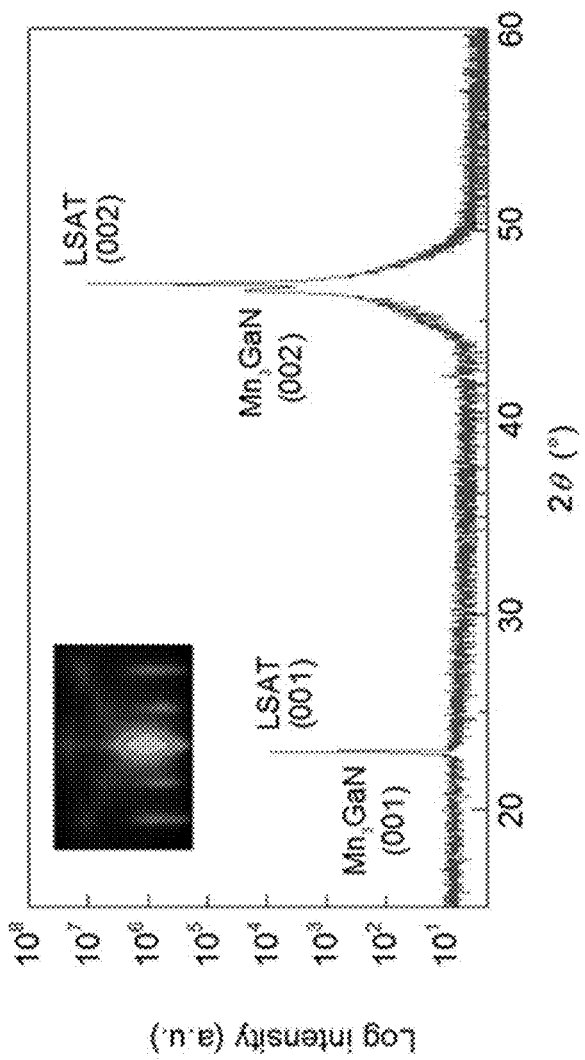
Figure 5C:
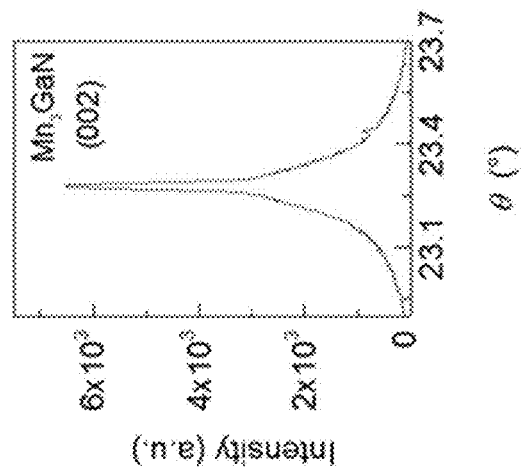
Figure 5D:
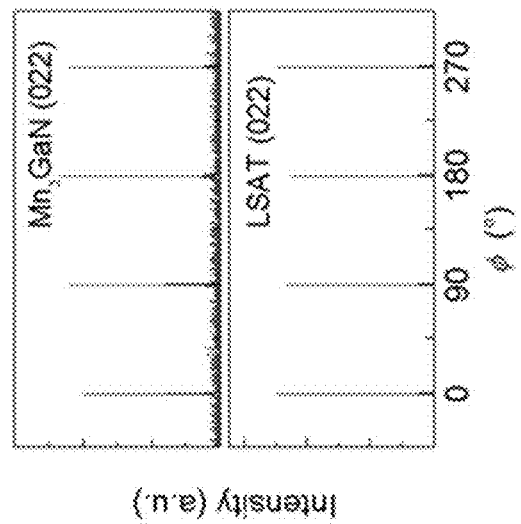
Figure 5E:
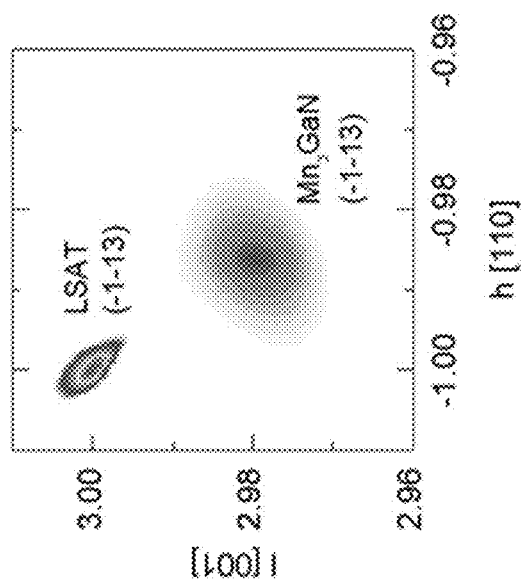

FIG. 5A depicts that the wide angle θ-2θ spectrum only shows the (001) reflections of LSAT substrate and Mn$_3$GaN film, demonstrating the film is (001)-oriented and single phase. Inset shows registered RHEED pattern of the specular diffraction spot after growth. FIG. 5B depicts that the short range θ-2θ scan around the (002) diffraction peak of the Mn$_3$GaN film showed Kiessig fringes, indicating pristine interfaces and high crystalline quality of the film. FIG. 5C depicts the rocking curve of the (002) Mn$_3$GaN peak. FIG. 5D depicts 360° φ-scans around the Mn$_3$GaN and LSAT (022) peaks, which demonstrates cube-on-cube epitaxial relationship. FIG. 5E depicts RSM around the LSAT (−113) reciprocal lattice point, which shows the Mn$_3$GaN is strain relaxed.

Figure 6C:
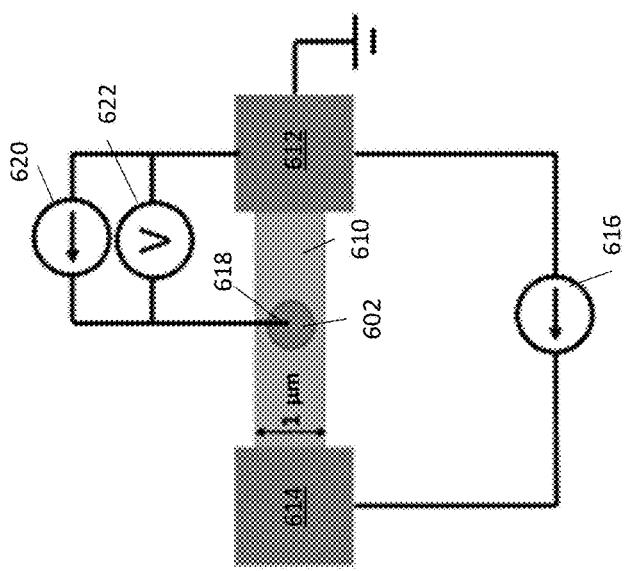
Figure 6B:
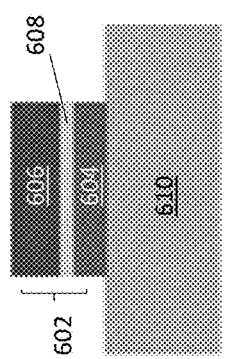
Figure 6A:
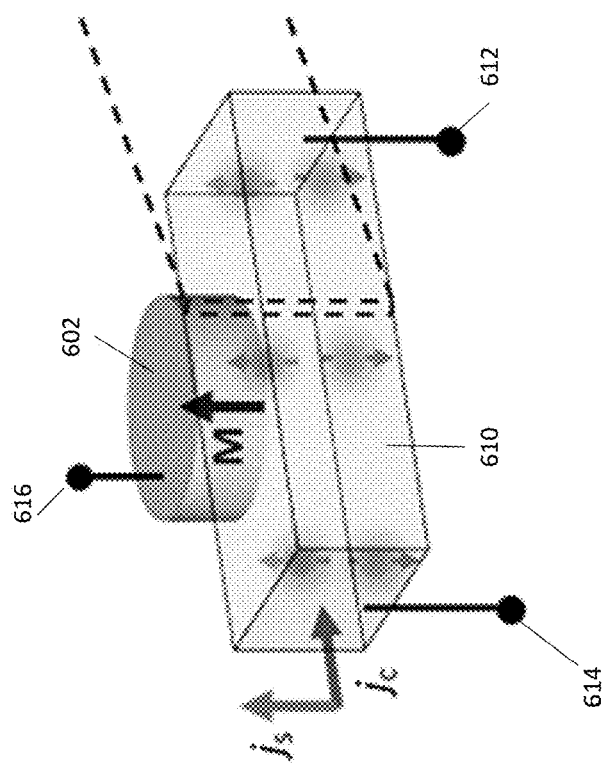

FIG. 6A is a schematic diagram showing a perspective view of a spin-Hall torque device, including the out-of-plane polarizations in the antiferromagnetic layer. FIG. 6B is a cross-sectional view of the device. FIG. 6C is a circuit diagram showing the reading and writing functions of the device.

DETAILED DESCRIPTION

Spintronic devices based on metallic antiferromagnets having a non-collinear spin structure are provided. Also provided are methods for operating the devices. Applications in which the spintronic devices can be used include non-volatile memory applications and logic function applications.

The spintronic devices are based on a bilayer structure that includes a spin torque layer of a metallic antiferromagnetic material having a non-collinear triangular spin structure adjoining a layer of ferromagnetic material. When coupled to its crystal lattice, the non-collinear spin structure of the antiferromagnet, reduces the symmetry of the system, allowing for the generation of spin currents with different spin polarization directions, including spin currents that are polarized along the out-of-plane direction.

Figure 1A:
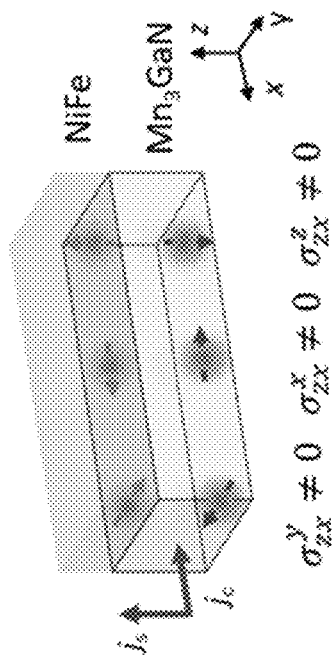
FIG. 1A-FIG. 1F depict the concept of the unconventional spin-Hall effect in $Mn_3GaN$.
Figure 1B:
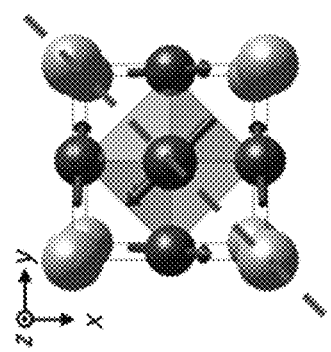

The unconventional spin structure of the ferromagnets is illustrated in FIG. 1A and FIG. 1B, which show a crystallographic unit cell of a crystalline antiferromagnetic material having a non-collinear spin structure, using Mn$_3$GaN as an example. As shown in these figures, the spins, which are represented by the arrows, are non-collinear because they are not arranged in a parallel, oppositely facing configuration. In the non-collinear spin structure, the spins adopt a triangular spin texture, which can be seen in FIG. 1G, which shows spin structure of the antiferromagnet in the (111) plane. This low symmetry spin state facilitates the generation of an unconventional spin-torque via the spin-Hall effect, which can be used to control the magnetization in an adjoining ferromagnet. As used herein, the term adjoining means in sufficiently close proximity that the spin-torque generated in the antiferromagnetic layer can modulate the magnetization in the ferromagnetic layer. Thus, an antiferromagnetic layer adjoining a ferromagnetic layer may in direct contact with the ferromagnetic layer, or may be spaced apart from the ferromagnetic layer by a thin layer of an intervening material, such as a metal (e.g., Cu or Al), that allows for spin current transmission between the two layers.

Figure 1C:
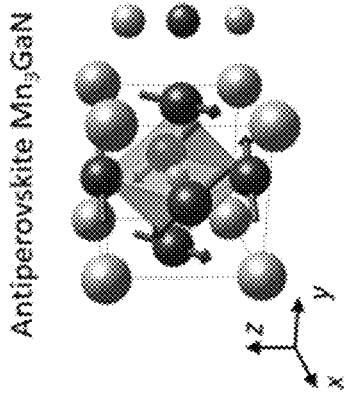

FIG. 1C illustrates the use of the unconventional spin-torque to modulate the magnetization of an adjoining ferromagnetic material. When an in-plane charge current ($j_c$) is passed through a layer of the metallic antiferromagnetic material, which is referred to as the spin torque layer and illustrated using Mn$_3$GaN in this example, a transverse spin current ($j_s$) having spin currents polarized in both in-plane and out-of-plane directions via the spin-Hall effect is generated. Such spin currents have not been observed in any other spin-Hall source materials. For comparison, the spin polarization directions for the spin current generated in a conventional antiferromagnet having collinear spins (FIG. 1D) is shown if FIG. 1F. As shown in that figure, the in-plane charge current generates transverse spin currents with spin polarizations that are required by symmetry to be orthogonal to both charge current ($j_c$) and spin current ($j_s$). These spin polarizations generate a spin-Hall torque in the ferromagnetic layer (illustrated using NiFe in this example), which can be used to manipulate the magnetization of the ferromagnet. A substantial disadvantage of the conventional antiferromagnet is that the in-plane polarized spin currents strongly favor only the manipulation of the magnetization of ferromagnets with in-plane magnetic anisotropy. In contrast, the unconventional spin structure of ferromagnets having a non-collinear spin structure allows for the manipulation of the magnetization of perpendicularly magnetized ferromagnets, which are used for high-density memory and logic devices.

In some embodiments of the spintronic devices, the magnetization in the ferromagnet is switched, but the magnetization state can be modulated (i.e., changed) in different ways as well. For example, a high frequency oscillation of the magnetization can be induced, which can be used for microwave and terahertz signal sources.

As shown in the FIG. 1C, an in-plane charge current is one that passes parallel to the interface between the spin-torque layer and the ferromagnetic layer and is defined along the x-axis in FIG. 1C. Although not shown in the figure, an in-plane charge current can be passed between a first electrical terminal and a second electrical terminal on opposite ends of the spin torque layer using a current source configured to pass a current between the terminals.

The spintronic devices can be operated at low temperatures, for example room temperature (~23° C.). They also can be operated at elevated temperatures, provided that they remain below the antiferromagnetic-to-paramagnetic transition temperature (Néel temperature) of the antiferromagnet.

The metallic antiferromagnetic materials can be incorporated as the spin-Hall source in a three-terminal spin-Hall torque device. One embodiment of a spin-Hall torque device is shown in FIG. 6A-6C. FIG. 6A is a schematic diagram showing a perspective view of the spin-Hall torque device, including the out-of-plane polarizations in the antiferromagnetic layer. FIG. 6B is a cross-sectional view of the device and FIG. 6C is a circuit diagram showing the reading and writing functions of the device.

The device includes an MTJ 602 having a free magnetic layer 604, a pinned magnetic layer 606, and a barrier layer 608 separating the free and pinned magnetic layers. The free magnetic layer is composed of a metallic ferromagnetic material and is characterized in that it has a magnetization that can be switched or otherwise changed. The pinned magnetic layer is composed of a ferromagnetic layer, but is characterized in that it has a fixed direction of magnetization. The barrier layer is composed of an electrically insulating material that is sufficiently thin to allow for election tunneling when a bias voltage is applied across the junction. The electrical resistance across the MTJ is controlled by the relative magnetizations of the free and pinned magnetic layers. By switching the magnetization direction of the free magnetic layer between two stable orientations, the resistance across (or impedance of) the MTJ can be switched between two values. These values represent two binary data states (1 and 0) for binary storage or logic applications. Thus, switching the direction of magnetization of the free magnetic layer provides the device's write cycle and measuring the resistance (or impedance) of the MTJ, typically with a very low voltage across the MTJ, provides the device's read cycle.

In the spin-Hall MTJ devices, the spin-Hall source 610 is provided by a layer of a non-collinear, antiferromagnetic material, as described herein, adjoining to the free magnetic layer. The device includes a first electrical terminal 612 and a second electrical terminal 614 on opposite ends of the spin-Hall source layer 610 and a current source 616 (i.e., a circuit that delivers an electric current) configured to pass a current (e.g., a "write" current through spin-Hall source 610 between the first and second electrical terminals. The device further includes a third electrical terminal 618 in electrical communication with pinned magnetic layer 606 and first electrical terminal 612 and a current source 620 configured to pass a current (e.g., a "read" current) through MTJ 602 between the first and third electrical terminals. A voltage source 622 is configured to apply a bias voltage across MTJ 602. During a write operation an in-plane current is passed through antiferromagnetic spin-Hall source 610 to induce magnetization switching by generating currents having out-of-plane spin polarizations in the spin-torque layer, giving rise to a spin torque in the free magnetic layer that switches its magnetization. During a read operation, a charge current is passed through MTJ 602 and the resistance of the MTJ is measured, where measuring the resistance can be directly measuring resistance or can be done indirectly by measuring the impedance.

The spintronic devices described herein can be used individually or can be provided as an array of device cells. For example, in magnetic random-access memory (MRAM) device can include an array of electronically coupled spin-Hall MTJ devices.

In the Examples below, a spintronic device comprising an $Mn_3GaN$ antiferromagnetic layer and a NiFe ferromagnetic layer is described in detail. However, it should be understood that this particular spintronic device is illustrative only and that other materials can be used. Other metallic, antiferromagnetic materials that have a non-collinear, triangular spin structure include other manganese nitrides having the formula $Mn_3AN$, where A is a transition metal, such as zinc, copper, or nickel. Still other metallic non-collinear antiferromagnets include $Mn_3Sn$, $Mn_3Ga$, $Mn_3Ge$, $Mn_3Ir$, and $Mn_3Pt$.

Suitable ferromagnetic materials for the ferromagnetic layers, including the free and pinned magnetic layers, in the devices include, but are not limited to, nickel (Ni), cobalt (Co), iron (Fe) and alloys thereof, including alloys of these elements with non-magnetic materials. Specific examples include, $Ni_{1-x}Fe_x$ alloys, $Co_xFe_yB_{a-(x+y)}$, and $Fe_{1-x}Pt_x$. Suitable dielectric materials that can be used as the barrier layer in an MTJ include oxides, such as magnesium oxide (MgO).

High quality, crystalline layer of the antiferromagnetic and ferromagnetic material can be grown epitaxially using, for example, reactive magnetron sputtering, on a growth substrate. However, the materials need not be single-crystalline. They can be polycrystalline or amorphous.

EXAMPLE 1

Figure 1D:
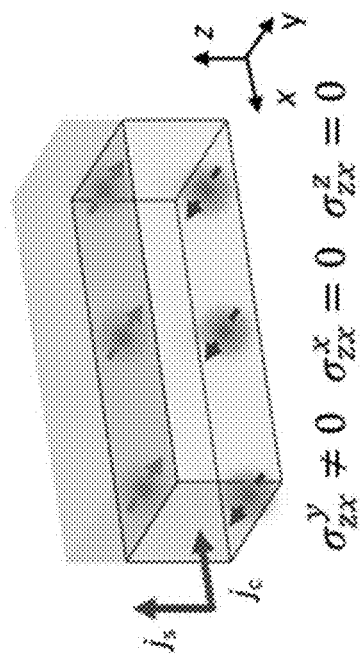
Figure 1E:
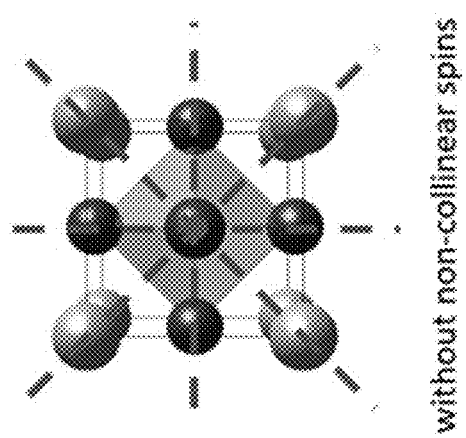
Figure 1F:
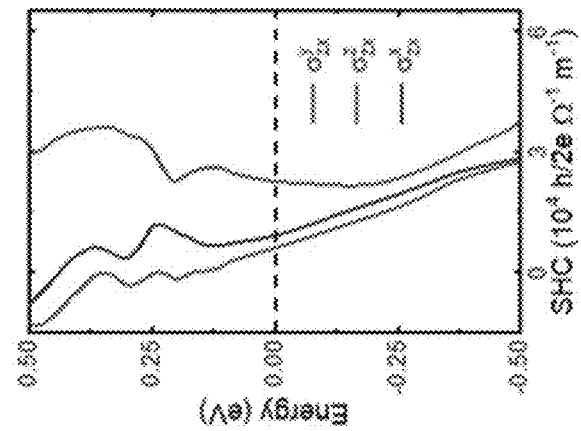
Figure 1G:
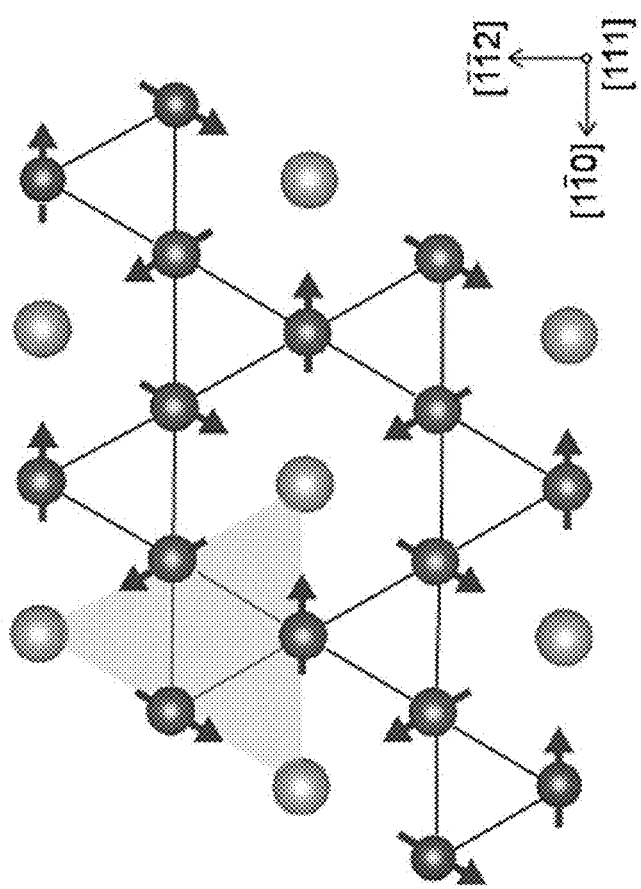
FIG. 1G. Spin structure of $Mn_3GaN$ in the (111) plane.

$Mn_3GaN$ is a metallic nitride with the antiperovskite crystal structure (identical to the perovskite structure, but with anion and cation positions interchanged) and a lattice parameter close to that of commonly used perovskite substrates. It exhibits antiferromagnetic ordering with a non-collinear $\Gamma^{5g}$ Kagome-like structure (magnetic space group: $R\bar{3}m$) stabilized by the magnetic frustration of the Mn atoms in the (111) plane (FIG. 1A). (Bertaut, E. F. et al., *Solid State Commun.* 6, 251-256 (1968) and Matsunami, D. et al., *Nat. Mater.* 14, 73-78 (2015).) In the (001) plane of $Mn_3GaN$ (FIG. 1B), the (110) plane was the only mirror plane. In this low-symmetry state, charge currents along x generated unconventional anti-damping torque components in the form of $\tau_x \propto m\times(m\times x)$ and $\tau_z \propto m\times(m\times z)$ in addition to the conventional $\tau_y \propto m\times(m\times y)$, which correspond to spin currents with $\sigma$ along x, z and y, respectively (FIG. 1C). These spin polarized currents have corresponding spin-Hall conductivities $\sigma_{zx}^x$, $\sigma_{zx}^z$ and $\sigma_{zx}^y$ (in the form of $\sigma_{jk}^i$, where i, j and k denote the spin polarization, spin current and charge current directions). FIG. 1D shows that $\sigma_{zx}^x$, $\sigma_{zx}^z$ and $\sigma_{zx}^y$ calculated by using the bulk $Mn_3GaN$ band structure were large within a wide energy window around the charge neutrality point, reflecting the existence of a sizable spin-Hall current even in the presence of charge carrier doping by defects. Above the antiferromagnetic-to-paramagnetic transition temperature (Néel temperature $T_N$), disordered spins gave rise to a high-symmetry state (space group: $Pm\bar{3}m$) having 4 mirror planes in the crystal lattice (FIG. 1E), where only conventional spin-Hall conductivity $\sigma_{zx}^y$ was non-zero.

Figures 2A, 2B:
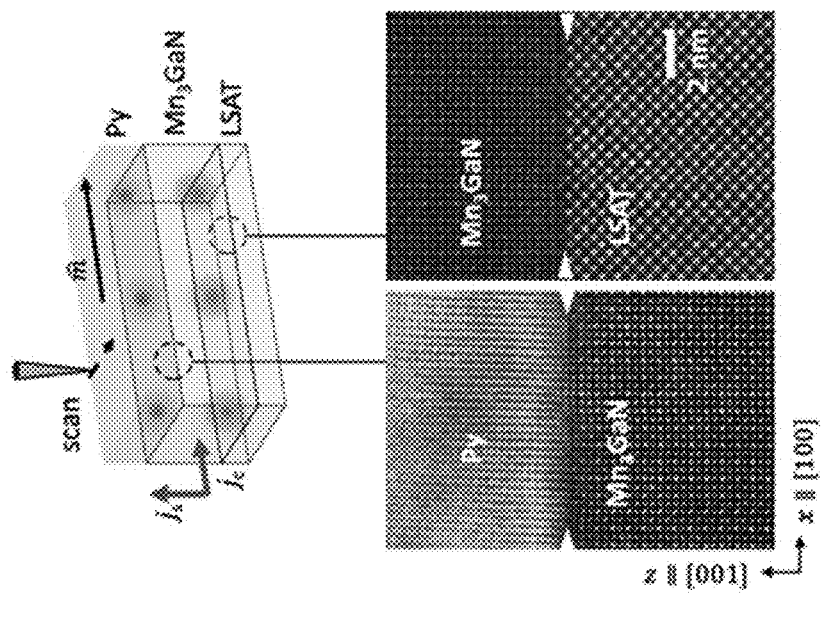
FIG. 2A-FIG. 2F depict polar MOKE measurements.

Epitaxial $Mn_3GaN$ thin films were grown on (001) $(La_{0.3}Sr_{0.7})(Al_{0.65}Ta_{0.35})O_3$ (LSAT) substrates by reactive magnetron sputtering with in-situ high-pressure RHEED (see Methods). The high crystalline quality of $Mn_3GaN$ and the cube-on-cube epitaxial relationship between the film and substrate were confirmed by x-ray diffraction. Ferromagnetic permalloy $Ni_{81}Fe_{19}$ (Py) thin films were then in situ deposited on $Mn_3GaN$ to form the $Py/Mn_3GaN$ bilayer, and finally were patterned into device bars for spin-torque measurements (FIG. 2A). FIG. 2B shows the cross-sectional filtered STEM-HAADF image of the bilayer, which reveals sharp interfaces between both $Mn_3GaN/LSAT$ (left) and $Py/Mn_3GaN$ (right). The in-plane magnetization of Py was measured with a SQUID magnetometer. Atomic force microscope images of the 10 nm Py/20 nm $Mn_3GaN$ surface indicated au atomically-smooth surface with a surface roughness of ~0.2 nm.

Figures 2C, 2D:
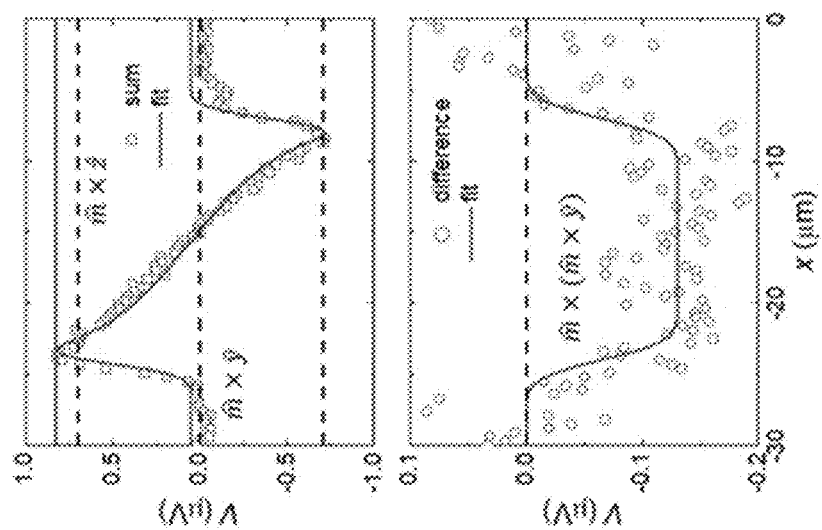
Figures 2E, 2F:
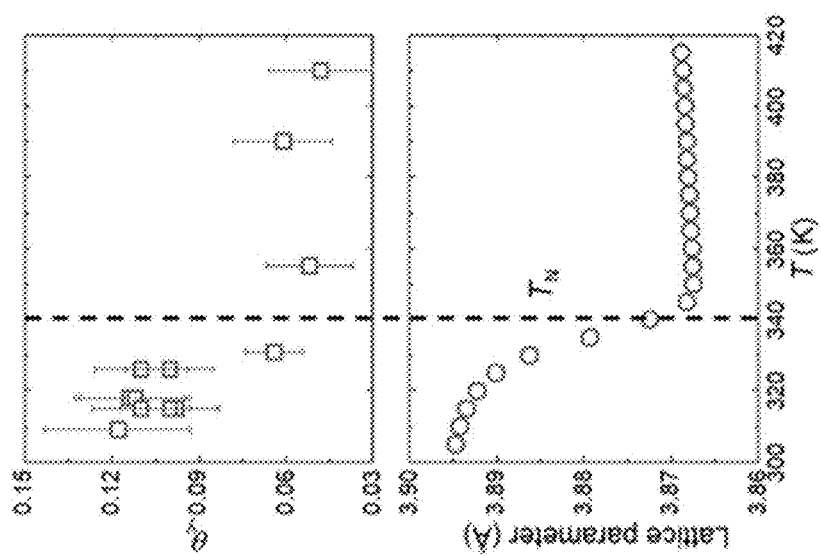

The conventional spin-torque in the $Py/Mn_3GaN$ was first characterized using the polar magneto-optic-Kerr-effect (MOKE) (Fan, X. et al. Nat. Commun. 5, 3042 (2014).) and its temperature dependence across the Néel temperature of $Mn_3GaN$. FIG. 2A shows the MOKE experimental geometry. The charge current and the Py magnetization lay along x, and the laser was normally incident onto a 20 µm×40 µm device. Kerr rotation data was acquired while the laser's focal point was scanned across the sample along y. As polar MOKE is sensitive to the out-of-plane magnetization, this technique measured the out-of-plane effective magnetic field ∝ m×y in Py that was produced by the conventional anti-damping torque m×(m×y). It also measured a spatially varying out-of-plane Oersted field generated by the charge current in $Mn_3GaN$. The anti-damping torque induced effective magnetic field changes sign when m is reversed, so repeating the experiment twice with m along x and -x allowed the anti-damping and Oersted signals to be separated. FIG. 2C and FIG. 2D show the sum and difference of the two MOKE signals measured at room temperature for a 10 nm Py/20 nm $Mn_3GaN$ sample, which were proportional to the Oersted field and spin-torque induced effective magnetic field, respectively. The conventional spin-torque ratio θy was determined to be 0.11±0.01 which describes the $\tau_y$ generation by spin current polarized along y absorbed by the Py relative to the charge current density in $Mn_3GaN$ via spin-Hall effect. This value is comparable to the spin-torque ratio reported in heavy metal Pt. (Liu, L. et al., Phys. Rev. Lett. 106, 036601 (2011).) The spin-torque ratio for $Py/Mn_3GaN$ was found to be robust against a zero-field cooling process which nullifies the exchange bias field at the $Py/Mn_3GaN$ interface. The temperature dependence of the torque ratio θy was further evaluated as shown in FIG. 2E. The torque ratio θy in $Py/Mn_3GaN$ drastically reduced to 0.056±0.005 around the $Mn_3GaN$ Néel temperature. The Néel temperature was determined by tracking the temperature dependence of the $Mn_3GaN$ out-of-plane lattice parameter (FIG. 2F) because the negative thermal expansion of $Mn_3GaN$ was accompanied with the first-order transition from the antiferromagnetic to the paramagnetic phase. (Takeuaka. K. et al., Appl. Phys. Lett. 87, 1-3 (2005).) The Néel temperature of $Mn_3GaN$ was also confirmed by the temperature dependence of the ordinary Hall coefficient and neutron diffraction. Such an abrupt change in θy was consistent with the theory calculation, where the spin-Hall conductivity $\sigma_{zx}^{y}$ for $Mn_3GaN$ changed from $2.3 \times 10^4 \hbar/2e\Omega^{-1}m^{-1}$ in the antiferromagnetic phase to $7 \times 10^3 \hbar/2e\Omega^{-1}m^{-1}$ in the paramagnetic phase. In the sum MOKE signal scan shown in FIG. 2C, there is a shift of the curve (different absolute value for positive and negative peaks), which indicates a uniformly distributed out-of-plane field produced by a field-like torque that was odd in m as, $\tau_{z,FL} \propto m \times z$. While any field-like torque due to Oersted field and Rashba-Edelstein effect would have the form of m×y, the presence of an in-plane field-like torque $\tau_{z,FL}$ in the $Py/Mn_3GaN$ indicates that the spin currents had polarization aligned away from y.

Figure 3A:
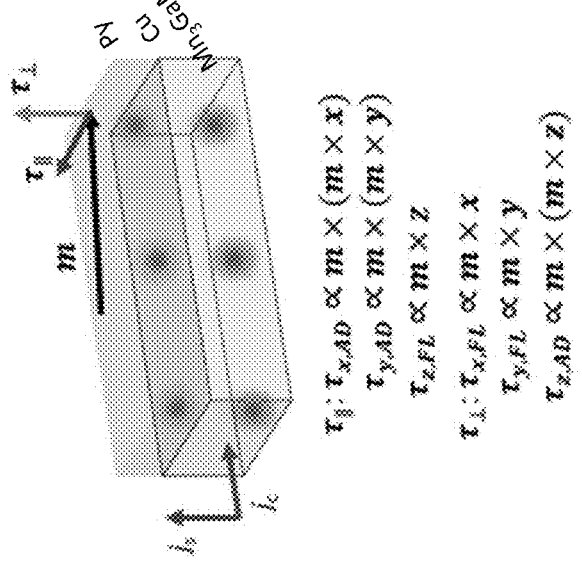
FIG. 3A-FIG. 3C depict spin-torque ferromagnetic resonance (ST-FMR) measurements.
Figure 3B:
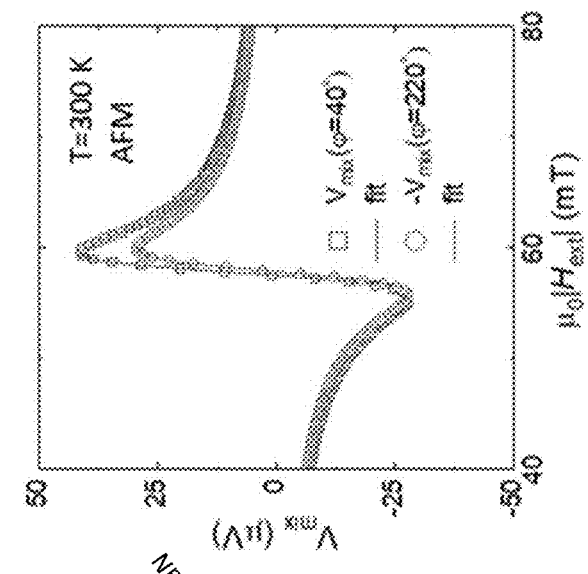
Figure 3C:
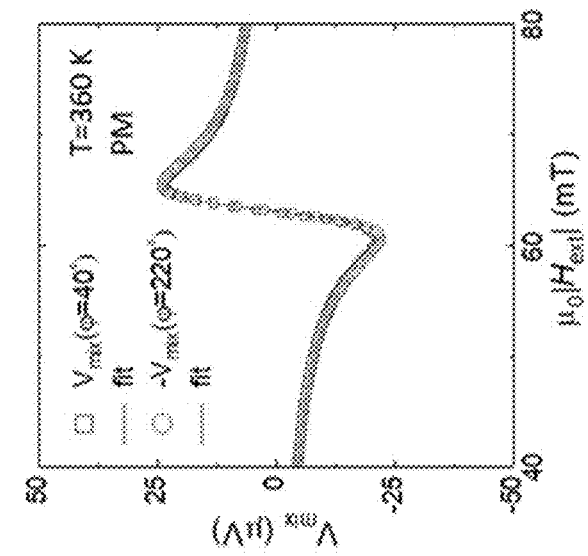

To analyze the symmetry of the spin torque components in more detail, the ST-FMR technique was used (FIG. 3A). (MacNeill, D. et al., Nat. Phys. 1, (2016) and Liu, L. et al., Phys. Rev. Lett. 106, 036601 (2011).) It was performed at room temperature and above the $Mn_3GaN$ Néel temperature. During the ST-FMR measurement, a microwave current applied to $Mn_3GaN$ produced alternating torques on the Py, and excited the Py magnetic moment into precession, generating a corresponding alternating sinusoidal change of the resistance R due to the anisotropic magnetoresistance (AMR) of Py. A dc voltage signal $V_{mix}$ was measured across the device bar that arose from the mixing between the alternating current and changes in the device resistance. The resonance in $V_{mix}$ was obtained by sweeping the external in-plane magnetic field through the Py resonance condition (see Methods). Both in-plane and out-of-plane torque components were then determined individually, as the symmetric and antisymmetric part of the line shape were proportional to the amplitude of the in-plane $\tau_\parallel$ and out-of-plane $\tau_\perp$ torque components, respectively. Considering only the conventional spin-Hall effect (or the Rashba-Edelstein effect and Oersted field), the in-plane and out-of-plane torque components would only have the form of m×(m×y) and m×y, respectively. (Mellnik, A. R. et al., Nature 511, 449-451 (2014) and Garello, K. et al., Nat. Nanotechnol. 8, 587-593 (2013).) When the sign of m was inverted by rotating the in-plane magnetic field angle φ (with respect to x) by 180°, the torque, and thus $V_{mix}$, also changed sign but retained the same amplitude, since $V_{mix}(\varphi)=-V_{mix}(\varphi+180°)$. Any additional, unconventional torque component present would cause a difference in the resonance line shape between $V_{mix}(\varphi)$ and $-V_{mix}(\varphi+180°)$.

FIG. 3B and FIG. 3C show the resonance spectral of the 10 nm Py/2 mu Cu/20 nm $Mn_3GaN$ sample with φ equal to 40° and 220°, and measured at 300 K and 360 K, respectively. The Cu insertion layer broke the exchange coupling at the $Py/Mn_3GaN$ interface, but it allowed the transmission of the spin current since Cu has a long spin diffusion length. The $V_{mix}(40°)$ and $-V_{mix}(220°)$ scans were notably different at 300 K (antiferromagnetic phase of $Mn_3GaN$), indicating the presence of the unconventional torque components. (MacNeill, D. et al., Nat. Phys. 1, (2016).) While heating the sample up to 360 K, despite the reduced resonance amplitude, the two scans overlapped with each other, indicating the absence of the unconventional torque components. These observations suggested the direct link between the non-collinear spin structure and the existence of unconventional spin toque.

To quantitatively examine the torque components, ST-FMR measurements were performed as a function of the in-plane magnetic field angle φ. FIG. 4A and FIG. 4B show the angular dependence of symmetric $V_{mix,S}$ and antisymmetric $V_{mix,A}$ part for the 10 nm Py/2 nm Cu/20 nm $Mn_3GaN$ sample, measured at 300 K and 360 K. Such angular dependence was understood as the product of the in-plane or out-of-plane torque components, and the AMR in Py, which has a dependence on φ [dR/dφ ∝ sin(2φ)], as $V_{mix,S} \propto \sin(2\varphi)\tau_\parallel$ and $V_{mix,A} \propto \sin(2\varphi)\tau_\perp$. The conventional anti-damping torque $\tau_{y,AD} \propto m \times (m \times y)$ and field-like torque $\tau_{y,FL} \propto m \times y$ have a cos(φ) dependence, giving rise to an overall angular dependence of the form sin(2φ)cos(φ) for both $V_{mix,S}$ and $V_{mix,A}$. This conventional model well describes the angular dependence of the $Py/Mn_3GaN$ when the $Mn_3GaN$ was in the paramagnetic phase. However, the angular dependence of both $V_{mix,S}$ and $V_{mix,A}$ for the antiferromagnetic $Mn_3GaN$ clearly deviated from this simple picture, but can be fitted by adding additional, unconventional torque terms with the presence of spin currents with spin polarizations oriented away from y. The spin currents that are polarized along x would generate torque [$\tau_{x,AD} \propto m \times (m \times x)$ and $\tau_{x,FL} \propto m \times x$] with a sin(φ) dependence; and the torque with spin polarization along z [$\tau_{z,AD} \propto m \times (m \times z)$ and $\tau_{z,FL} \propto m \times z$], since m is oriented in the plane, are independent of φ. Thus, $V_{mix,S}(\varphi)$ and $V_{mix,A}(\varphi)$ were fit to more general forms to take all possible torque terms into account:

$$V_{mix,S}(\varphi)=\sin(2\varphi)(T_{x,AD}\sin(\varphi)+T_{y,AD}\cos(\varphi)+T_{z,FL}) \quad (1)$$

$$V_{mix,A}(\varphi)=\sin(2\varphi)(T_{x,FL}\sin(\varphi)+T_{y,FL}\cos(\varphi)+T_{z,AD}) \quad (2)$$

where $T_{v,u}$ is a constant and proportional to the amplitude of $\tau_{v,u}$ (v=x, y, or z; u=AD or FL). The $T_{v,u}$ values in both antiferromagnetic and paramagnetic phases are summarized in FIG. 4C and FIG. 4D, from which several key findings can be extracted.

In the paramagnetic phase, only conventional terms ($T_{y,AD}$, $T_{y,FL}$) present. In the antiferromagnetic phase, the non-zero anti-damping torque terms $T_{x,AD}$, $T_{y,AD}$ and $T_{z,AD}$ demonstrated the existence of unconventional torque terms $\tau_{x,AD}$ and $\tau_{z,AD}$ in addition to the conventional torque term $\tau_{y,AD}$. The out-of-plane anti-damping torque $\tau_{z,AD}$ has been observed previously in a system with low crystalline symmetry, Py/WTe$_2$. (MacNeill, D. et al., *Nat. Phys.* 1, (2016).) The new in-plane anti-damping torque term $\tau_{x,AD}$ that existed in Py/Mn$_3$GaN had not been found in other lower-crystalline-symmetry systems, but was consistent with the symmetry allowed spin currents derived from the non-collinear antiferromagnetic Mn$_3$GaN magnetic space group. The strength of individual torque terms was parameterized into the spin-torque ratios $\theta_v$ (v=x, y, or z), where $\theta_v$ denoted the efficiency of the $\tau_{v,AD}$ generation (see Method). For Mn$_3$GaN in antiferromagnetic phase, $\theta_x$=0.023±0.003, $\theta_y$=0.12±0.003 and $\theta_z$=0.013±0.001 were found, where the conventional torque ratio $\theta_y$ agreed with that measured by MOKE (FIG. 3A-FIG. 3B). To make a direct comparison with the theory calculation and experimental results, the experimental torque ratios were converted to the corresponding spin-Hall conductivity $$\sigma^i_{jk}(=\frac{\hbar}{2e}\sigma,$$

where σ is the conductivity of the Mn$_3$GaN) with spin currents polarized along i, yielding $\sigma_{zx}^x$=9.3×10$^3\hbar$/2e $\Omega^{-1}$m$^{-1}$, $\sigma_{zx}^y$=4.8×10$^4\hbar$/2e $\Omega^{-1}$m$^{-1}$, and $\sigma_{zx}^z$=5.3×10$^3\hbar$/2e $\Omega^{-1}$m$^{-1}$, which were comparable with the calculated values (FIG. 1D). This indicates the origin of the observed unconventional torques originated from the bulk spin-Hall effect.

Methods

Sample Growth, Fabrication and Characterization

Epitaxial Mn$_3$GaN thin films were grown on (001)-oriented LSAT substrates by DC reactive magnetron sputtering using a stoichiometric Mn$_3$Ga target in a vacuum chamber with a base pressure of 1×10$^{-8}$ Torr. During the growth, Mn$_3$GaN growth mode and surface crystalline structure was monitored by in situ reflection high energy election diffraction (RHEED). The growth underwent a 3D to 2D growth mode transition. A streaky RHEED pattern after the deposition implied a smooth film surface. The growth was performed at a substrate temperature of 550° C. and an Ar (62 sccm)/N$_2$ (8 sccm) atmosphere of 10 mTorr. After the Mn$_3$GaN growth, the sample was cooled down in vacuum. The Py was then subsequently sputter deposited at an Ar pressure of 3 mTorr. The atomically flat Py surface on top of Mn$_3$GaN was verified using atomic force microscopy. The thickness, epitaxial arrangement, and coherence of the Mn$_3$GaN films were confirmed using x-ray reflectivity, x-ray diffraction, and reciprocal space mappings. The thickness of Py films was measured by using x-ray reflectivity.

The Py/Mn$_3$GaN sample was patterned by using photolithography followed by ion beam milling. Then 200 nm Pt/5 nm Ti electrodes were sputter deposited and defined by a lift-off procedure. Devices for ST-FMR and MOKE were patterned into microstrips (20-50 μm wide and 40-100 μm long) with ground-signal-ground electrodes. Devices for electrical transport measurements were patterned into 100 μm wide and 500 μm long Hall bars.

STEM Measurements.

The STEM sample was prepared through the mechanical flat polishing down to a thickness of ~10 μm by using the precise polishing system (EM TXP, Leica). The polished specimen was ion-milled using Ar ion beam having the voltage range of 1-3 keV (PIPS II, Gatan) to make the hole for the STEM observation. After that, the low energy milling was performed using 0.1 keV Ar beam to minimize the surface damage from the prior ion-milling process.

The atomic structures were observed using a STEM (JEM-ARM200F, JEOL) at 200 kV equipped with an aberration collector (ASCOR, CEOS GmbH). The optimum size of the election probe was ~0.8 Å. The collection semi-angles of the HAADF detector were adjusted from 68 to 280 mrad in order to collect large-angle elastic scattering electrons for clear Z-sensitive images. The obtained raw images were processed with a band-pass Wiener filter with a local window to reduce a background noise (HREM research Inc.).

MOKE Measurements

Polar MOKE measurements allowed for the measurement of the small out-of-plane magnetizations induced by the Oersted field and $\tau_{y,AD}$ present in Py/Mn$_3$GaN bilayers. The Oersted field magnitude depended only on the sample current and physical dimensions of the pattern, known quantities, and could be used to self-calibrate the measurements. A spin current was excited with a 21.1 kHz AC charge current, creating Oersted and in-plane anti-damping torques oscillating at this same frequency. The sample was mounted on a motion stage, affixed between the poles of an electromagnet, and aligned so that the current and applied magnetic field directions were parallel to x. A 633 nm HeNe was intensity stabilized, p-polarized (polarized along y) and focused to ~3 μm spot on the sample. The focal spot was scanned along y (perpendicular to the current), and the Kerr rotation was recorded for both Py magnetization along x and −x. To detect the Kerr rotation, the polarization of the beam reflected from the sample was rotated 45°, using a λ/2 plate, and then split into s- and p-polarization components. A balanced differential photodetector subtracted the two components, producing a signal proportional to Kerr rotation. The differential signal was amplified with a lock-in referenced to the sample current source (21.1 kHz). The sum of the lock-in outputs for x and −x magnetization was proportional to the Oersted field, and the difference to $\tau_{y,AD}$.

To calculate the torque ratio $\theta_y$, further analysis of the sum and difference signals was conducted. The sum signal was fit to the known out-of-plane Oersted field functional form (easily computed from the Biot-Savart law) convolved with a gaussian (because the spatial distribution in optical intensity of the laser beam is gaussian). This fit yielded the sensitivity (in V/T) of the final lock-in output to the out-of-plane magnetic fields responsible for canting the Py moments. The difference signal was fit to the convolution of a "box" function (zero everywhere not on the sample, and constant across the width of the sample) and a gaussian. The height of this function, converted to units of field using the experimental sensitivity (V/T), was the magnitude of the out-of-plane effective field due to $\tau_{y,AD}$. As non-linear curve fitting with many parameters can be a hazardous endeavor, the torque ratios were cross-checked against another analysis method. The torque ratio could also be related directly to the ratio of the area under the absolute value of the differential signal to the area under the sum signal. (Fan, X. et al., *Appl. Phys. Lett.* 109, 122406 (2016).)

ST-FMR Measurements.

During ST-FMR measurements, a microwave current at a fixed frequency (5 to 8 GHz) was applied through the ac port of a bias-T to a RF ground-signal-ground probe tip. The microwave power was 13 dBm. The in-plane magnetic fields were generated by a rotary electromagnet which allowed for magnetic field angle dependence of ST-FMR measurements. Magnetic fields were swept from 0-0.12 T for driving the Py through its resonance condition. The resonance line shape was fitted to a sum of symmetric $V_S$ and antisymmetric $V_A$ Lorentzian components in the form as $$V_{mix} = V_{mix,S} \frac{W^2}{(\mu_0 H_{ext} - \mu_0 H_{FMR})^2 + W^2} + V_{mix,A} \frac{W(\mu_0 H_{ext} - \mu_0 H_{FMR})}{(\mu_0 H_{ext} - \mu_0 H_{FMR})^2 + W^2},$$

where W is the half-width-at-half-maximum resonance linewidth, $\mu_0$ is the permeability in vacuum and $H_{FMR}$ is the resonance field. The in-plane $\tau_\parallel$ and out-of-plane $\tau_\perp$ components were proportional to $V_{mix,S}$ and $V_{mix,A}$ components, which can be expressed as.

$$V_{mix,S} = -\frac{I_{rf}}{2}\left(\frac{dR}{d\varphi}\right)\frac{1}{\alpha(2\mu_0 H_{FMR} + \mu_0 M_{eff})}\tau_\parallel \quad (1)$$

$$V_{mix,A} = -\frac{I_{rf}}{2}\left(\frac{dR}{d\varphi}\right)\frac{\sqrt{1 + M_{eff}/H_{FMR}}}{\alpha(2\mu_0 H_{FMR} + \mu_0 M_{eff})}\tau_\perp \quad (2)$$

where $I_{rf}$ is the microwave current, R is the device resistance as a function of in-plane magnetic field angle φ due to the AMR of Py, α is the Gilbert damping coefficient, and $M_{eff}$ is the effective magnetization. The AMR of Py was determined by measuring the device resistance as a function of magnetic field angle where the field was kept at 0.1 T. The microwave current $I_{rf}$ was calibrated by measuring the microwave current induced device resistance change due to Joule heating effect. (Tshitoyan, V. et al., *Phys. Rev. B* 92, 214406 (2015) and Zhang, W. et al., *Phys. Rev. B—Condens. Matter Mater. Phys.* 92, 1-7 (2015).)

Electrical Transport Measurements of $Mn_3GaN$.

Electrical transport measurements of $Mn_3GaN$ films were performed directly on as-grown films wire-bonded in a four-corner van der Pauw geometry. Both sheet resistance and Hall resistance were measured with changing temperature and magnetic induction in a Quantum Design Physical Property Measurement System. Film resistivity was computed by solving the van der Pauw equation in conjunction with film thickness as measured with x-ray reflectivity, while Hall resistance was calculated by summing the two approximately orthogonal Hall configurations.

Temperature Dependence of Neutron Diffraction.

Single crystal neutron diffraction measurements were performed on the WISH time-of-flight diffractometer at ISIS, the UK neutron and muon source. (Chapon, L. C. et al., *Neutron News* (2011). doi:10.1080/10448632.2011.569650) An approximately 205 nm thick (001) $Mn_3GaN$ thin film sample, with lateral dimensions 10×10 mm, was oriented for the measurement of nuclear and magnetic diffraction intensities in the (HHL) reciprocal lattice plane. Specifically, the sample was rotated such that the (001) diffraction peak could be measured with optimal resolution and incident flux. The sample was first mounted within a $^4$He cryostat, and diffraction patterns were collected from a base temperature of 1.5 K up to 300 K. in 50 K steps. The sample was transferred to a medium-range furnace, and diffraction patterns were then collected at 350, 370, and 390 K.

Temperature Dependence of X-ray Diffraction.

The x-ray diffraction data was acquired at beamline 6-ID-B at the Advanced Photon Source with 12 keV incident x-ray energy. The sample temperature was controlled employing an ARS high temperature cryostat. Data was taken with 5 K steps, at each temperature sample position was realigned with respect to base temperature reciprocal space matrix. Sample was mounted on a standard PSI Huber diffractometer.

Theoretical Calculations.

The electronic band structure of $Mn_3GaN$ was calculated by using the First-principles density functional theory (DFT) calculations with Quantum ESPRESSO with fully relativistic ultrasoft pseudopotentials. (Giannozzi, P. et al., *J. Phys. Condens. Matter* 21, (2009) and Vanderbilt, D., *Phys. Rev. B* 41, 7892-7895 (1990).) The exchange and correlation effects were treated within the generalized gradient approximation (GGA). (Perdew, J. P. et al., *Phys. Rev. Lett.* 77, 3865-3868 (1996).) The plane-wave cut-off energy of 57 Ry and a 16×16×16 k-point mesh in the irreducible Brillouin zone were used in the calculations. Spin-orbit coupling and non-collinear $\Gamma^{5g}$ antiferromagnetism were included in all electronic structure calculations.

The spin-Hall effect is given by $$\sigma_{ij}^k = \frac{e^2}{\hbar}\int\frac{d^3\vec{k}}{(2\pi)^3}\sum_n f_{n\vec{k}}\Omega_{n,ij}^k(\vec{k}),$$

$$\Omega_{n,ij}^k(\vec{k}) = -2Im\Sigma_{n\neq n'}\frac{\langle n\vec{k}|J_i^k|n'\vec{k}\rangle\langle n'\vec{k}|v_j|n\vec{k}\rangle}{(E_{n\vec{k}} - E_{n'\vec{k}})^2},$$

where $f_{n\vec{k}}$ is the Fermi-Dirac distribution for the nth band, $J_i^k = \frac{1}{2}\{v_i, s_k\}$ is the spin current operator with spin operator $s_k$, $$v_j = \frac{1}{\hbar}\frac{\partial H}{\partial k_j}$$

is the velocity operator, and i,j,k=x,y,z. (Gradhand, M. et al., *Journal of Physics Condensed Matter* 24, (2012).)

$\Omega_{n,ij}^k(\vec{k})$ is referred to as the spin Berry curvature in analogy to the ordinary Berry curvature. In order to calculate the spin-Hall conductivities, the tight-binding Hamiltonians were constructed using PAOFLOW code based on the projection of the pseudo-atomic orbitals (PAO) from the non-self-consistent calculations with a 16×16×16 k-point mesh. (Buongiorno Nardelli, M. et al., *Comput. Mater. Sci.* 143, 462-472 (2018); Agapito, L. A. et al., *Phys. Rev. B—Condens. Matter Mater. Phys.* 88, (2013); and Agapito, L. A. et al., *Phys. Rev. B* 93, (2016).) The spin-Hall conductivities were calculated using the tight-binding Hamiltonians with a 48×48×48 k-point mesh by the adaptive broadening method to get the converged values.

EXAMPLE 2

This example describes the growth of high-quality epitaxial $Mn_3GaN$ films on (001)-oriented LSAT and $SrTiO_3$ single-crystal substrates as paradigms of $M_3XN/ABO_3$ interfaces.

FIG. 5A-FIG. 5E summarize the x-ray diffraction (XRD) structural characterization for a 60 nm thick $Mn_3GaN$ film grown on a (001) LSAT substrate. The epitaxial growth and single-phase structure of the films was monitored using in-situ reflection high-energy electron diffraction (RHEED) and confirmed through symmetric $\theta$-$2\theta$ XRD measurements by the observation of only the (001) reflections (FIG. 5A). FIG. 5B shows a representative $\theta$-$2\theta$ XRD scan taken around the (002) LSAT substrate peak. The presence of Kiessig fringes surrounding the $Mn_3GaN$ (002) peak indicates the high crystalline quality of the film and a pristine interface. The narrow 0.035° full-width at half-maximum (FWHM) value measured from the $Mn_3GaN$ (002) rocking curve demonstrates the high crystalline quality of the $Mn_3GaN$ film (FIG. 5C). Decreasing the thickness of the films resulted in an improvement of the crystallinity, reaching films with FWHM values as low as 0.023°. The in-plane cube-on-cube epitaxial relationship between $Mn_3GaN$ film and substrate was confirmed by off-axis azimuthal $\phi$-scan around the (022) reflection (FIG. 5D). From x-ray reciprocal space mapping (RSM) measurements centered in the asymmetrical (-113) LSAT peak (FIG. 5B), the out-of-plane ($\alpha_\perp$) and in-plane ($\alpha_\parallel$) lattice constant was determined to be $\alpha_\perp$=3.90±0.01 Å and $\alpha_\parallel$=3.92±0.01 Å, which was in good agreement with the lattice constant value reported to bulk $Mn_3GaN$, $\alpha$=3.898 Å. (Bertaut, E. F. et al., *Solid State Commun.* 1968, 6, 251-256.)

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A spintronic device comprising:
   a ferromagnetic layer comprising a ferromagnetic material having perpendicular magnetization;
   a spin-torque layer comprising a metallic antiferromagnetic material having a non-collinear spin structure adjoining the ferromagnetic layer at an interface, the metallic antiferromagnetic material characterized in that it is capable of generating spin currents having non-zero out-of-plane spin polarizations when an in-plane charge current is passed through the spin-torque layer; and
   a current source configured to pass an in-plane charge current through the spin torque layer.

2. The device of claim 1, wherein the metallic antiferromagnetic material having a non-collinear spin structure comprises a nitride having the formula $Mn_3AN$, where A is gallium, zinc, copper, or nickel.

3. The device of claim 2, where A is gallium.

4. A method of modulating the magnetization in a spintronic device comprising:
   a ferromagnetic layer comprising a ferromagnetic material having a perpendicular magnetization;
   a spin-torque layer comprising a metallic antiferromagnetic material having a non-collinear spin structure in contact with the ferromagnetic layer at an interface; and
   a current source configured to pass an in-plane charge current through the spin-torque layer, the method comprising:
   passing an in-plane charge current through the spin-torque layer, whereby spin currents having out-of-plane spin polarizations are generated in the spin-torque layer giving rise to a spin torque in the ferromagnetic layer that modulates the magnetization of the ferromagnetic material.

5. The method of claim 4, wherein the spin torque in the ferromagnetic layer switches the magnetization of the ferromagnetic material.

6. The method of claim 4, wherein the metallic antiferromagnetic material having a non-collinear spin structure comprises a nitride having the formula $Mn_3AN$, where A is gallium, zinc, copper, or nickel.

7. A magnetic tunnel junction device comprising;
   a magnetic tunnel junction comprising:
      a free magnetic layer comprising a ferromagnetic material having a perpendicular magnetization;
      a pinned layer comprising a ferromagnetic material having a fixed direction of magnetization; and
      a barrier layer comprising an electrically insulating material separating the ferromagnetic layer from the pinned layer;
   a spin torque layer comprising a metallic antiferromagnetic material having a non-collinear spin structure in contact with the free magnetic layer at an interface, the metallic antiferromagnetic material characterized in that it is capable of generating spin currents having non-zero out-of-plane spin polarizations when an in-plane charge current is passed through the spin-torque layer;
   a write current source configured to pass an in-plane charge current through the spin torque layer;
   a read current source configured to pass a charge current through the magnetic tunnel junction; and
   a voltage source configured to apply a bias voltage between the pinned layer and the spin-torque layer.

8. The device of claim 7, wherein the metallic antiferromagnetic material having a non-collinear spin structure comprises a nitride having the formula $Mn_3AN$, where A is gallium, zinc, copper, or nickel.

9. The device of claim 8, where A is gallium.

10. A method of operating a magnetic tunnel junction device comprising:
    a magnetic tunnel junction comprising:
    a free magnetic layer comprising a ferromagnetic material having a perpendicular magnetization;
    a pinned layer comprising a ferromagnetic material having a fixed direction of magnetization; and
    a barrier layer comprising an electrically insulating material separating the ferromagnetic layer from the pinned layer;
    a spin torque layer comprising a metallic antiferromagnetic material having a non-collinear spin structure in contact with the free magnetic layer at an interface;
    a write current source configured to pass an in-plane charge current through the spin torque layer; and a read current source configured to pass a charge current through the magnetic tunnel junction, the method comprising:

passing an in-plane write current through the spin torque layer, whereby spin currents having out-of-plane spin polarizations are generated in the spin-torque layer, giving rise to a spin torque in the free magnetic layer that switches the magnetization of the free magnetic layer; and passing a read current through the magnetic tunnel junction and measuring the resistance of the magnetic tunnel junction.

11. The method of claim 10, wherein the metallic antiferromagnetic material having a non-collinear spin structure comprises a nitride having the formula $Mn_3AN$, where A is gallium, zinc, copper, or nickel.

12. The method of claim 11, where A is gallium.

13. The method of claim 6, where A is gallium.

\* \* \* \* \*

UNITED STATES PATENT AND TRADEMARK OFFICE
CERTIFICATE OF CORRECTION

Page 1 of 2

PATENT NO. : 10,804,459 B2
APPLICATION NO. : 16/225071
DATED : October 13, 2020
INVENTOR(S) : Chang-Beom Eom et al.

It is certified that error appears in the above-identified patent and that said Letters Patent is hereby corrected as shown below:

In the Specification

Column 2, Line 30:

Delete the phrase "$\sigma_{zx}{}^y$, $\sigma_{zx}{}^x$ and $\sigma_{zx}{}^z$," and replace with -- $\sigma_{zx}^y$, $\sigma_{zx}^x$ and $\sigma_{zx}^z$, --.

Column 2, Line 34:

Delete the phrase "$\sigma_{zx}{}^y$, $\sigma_{zx}{}^x$ and $\sigma_{zx}{}^z$," and replace with -- $\sigma_{zx}^y$, $\sigma_{zx}^x$ and $\sigma_{zx}^z$, --.

Column 2, Line 41:
Delete the phrase "$\sigma_{zx}{}^y$" and replace with -- $\sigma_{zx}^y$ --.

Column 6, Line 37:
Delete the phrase "$\sigma_{zx}{}^x$, $\sigma_{zx}{}^z$ and $\sigma_{zx}{}^y$ (in the form of $\sigma_{jk}{}^i$," and replace with -- $\sigma_{zx}^x$, $\sigma_{zx}^z$ and $\sigma_{zx}^y$ (in the form of $\sigma_{jk}^i$, --.

Column 6, Line 39-40:

Delete the phrase "$\sigma_{zx}{}^x$, $\sigma_{zx}{}^z$ and $\sigma_{zx}{}^y$" and replace with -- $\sigma_{zx}^x$, $\sigma_{zx}^z$ and $\sigma_{zx}^y$ --.

Column 6, Line 48:
Delete the phrase "$\sigma_{zx}{}^y$" and replace with -- $\sigma_{zx}^y$ --.

Column 6, Line 64:
Delete the phrase "au atomically-smooth surface" and replace with --an atomically-smooth surface--.

Column 7, Line 39:
Delete the phrase "(Takeuaka, K. et al.," and replace with --(Takenaka, K. et al.,--.

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)

Column 7, Line 44:
Delete the phrase "$\sigma_{zx}{}^y$" and replace with --$\sigma_{zx}^y$--.

Column 7, Lines 45-46:
Delete the phrase "$7 \times 10^3 \hbar/2e\Omega_1^- m^{-1}$" and replace with --$7 \times 10^3 \hbar/2e\Omega^{-1} m^{-1}$--.

Column 9, Lines 36-38:
Delete the phrase "$\sigma_{zx}{}^x = 9.3 \times 10^3 \hbar/2e\ \Omega^{-1} m^{-1}$, $\sigma_{zx}{}^y = 4.8 \times 10^4 \hbar/2e\ \Omega^{-1} m^{-1}$, and $\sigma_{zx}{}^z = 5.3 \times 10^3 \hbar/2e\ \Omega^{-1} m^{-1}$," and replace with
-- $\sigma_{zx}^x = 9.3 \times 10^3 \hbar/2e\ \Omega^{-1} m^{-1}$, $\sigma_{zx}^y = 4.8 \times 10^4 \hbar/2e\ \Omega^{-1} m^{-1}$, and $\sigma_{zx}^z = 5.3 \times 10^3 \hbar/2e\ \Omega^{-1} m^{-1}$, --.

Column 9, Lines 48-49:
Delete the phrase "high energy election diffraction" and replace with --high energy electron diffraction--.

Column 10, Lines 14-15:
Delete the phrase "aberration collector" and replace with --aberration corrector--.

Column 10, Line 16:
Delete the phrase "election probe" and replace with --electron probe--.

Column 12, Line 48:
Delete the phrase "$\Omega_{n,ij}{}^k(\vec{k})$" and replace with --$\Omega_{n,ij}^k(\vec{k})$--.

Column 13, Lines 22-24:
Delete the phrase "the out-of-plane ($\alpha_\perp$) and in-plane ($\alpha_\parallel$) lattice constant was determined to be $\alpha_\perp = 3.90 \pm 0.01$ Å and $\alpha_\parallel = 3.92 \pm 0.01$ Å," and replace with --the out-of-plane ($a_\perp$) and in-plane ($a_\parallel$) lattice constant was determined to be $a_\perp = 3.90 \pm 0.01$ Å and $a_\parallel = 3.92 \pm 0.01$ Å,--.